United States Patent
Wen et al.

(10) Patent No.: US 10,475,639 B2
(45) Date of Patent: Nov. 12, 2019

(54) APPARATUS AND METHOD FOR PROCESSING SEMICONDUCTOR WAFER SURFACE WITH OZONE-CONTAINING FLUID

(71) Applicant: Wuxi Huaying Microelectronics Technology Co., Ltd., Wuxi, Jiangsu (CN)

(72) Inventors: Sophia Wen, Wuxi (CN); Nitao Zhang, Wuxi (CN)

(73) Assignee: WUXI HUAYING MICROELECTRONICS TECHNOLOGY CO., LTD, Wuxi (CN)

( * ) Notice: Subject to any disclaimer, the term of this patent is extended or adjusted under 35 U.S.C. 154(b) by 179 days.

(21) Appl. No.: 15/503,682

(22) PCT Filed: Jul. 29, 2015

(86) PCT No.: PCT/CN2015/085371
§ 371 (c)(1),
(2) Date: Feb. 13, 2017

(87) PCT Pub. No.: WO2016/023414
PCT Pub. Date: Feb. 18, 2016

(65) Prior Publication Data
US 2017/0271147 A1    Sep. 21, 2017

(30) Foreign Application Priority Data

Aug. 14, 2014 (CN) .......................... 2014 1 0401635

(51) Int. Cl.
*H01L 21/02* (2006.01)
*B08B 3/08* (2006.01)
(Continued)

(52) U.S. Cl.
CPC .......... *H01L 21/02052* (2013.01); *B08B 3/08* (2013.01); *B08B 3/14* (2013.01); *H01L 21/67023* (2013.01); *B08B 2203/005* (2013.01)

(58) Field of Classification Search
CPC ......... H01L 21/02052; H01L 21/67051; H01L 21/67023; H01L 21/02233; H01L 21/205;
(Continued)

(56) References Cited

U.S. PATENT DOCUMENTS

| 5,979,474 A | * | 11/1999 | Manako | .................... B08B 3/10 134/102.1 |
| 2003/0084927 A1 | * | 5/2003 | Yotsumoto | ................ B08B 3/08 134/36 |

FOREIGN PATENT DOCUMENTS

| EP | 0548596 A2 * | 6/1993 | ....... H01L 21/02046 |
| EP | 0548596 A3 | 6/1993 | |

* cited by examiner

*Primary Examiner* — David G Cormier
*Assistant Examiner* — Thomas Bucci
(74) *Attorney, Agent, or Firm* — Han IP PLLC; Andy M. Han

(57) ABSTRACT

An apparatus and a method for processing one or more surfaces of a semiconductor wafer with one or more ozone-containing fluids are provided. The apparatus includes an ozone generator, a solvent flask, a gas-liquid mixing device, and a processing chamber capable of receiving the semiconductor wafer. The apparatus may also include one or more gas-liquid separation devices and switching valves. The processing chamber allows the ozone-containing fluids to enter the processing chamber for treating the wafer surface. The effectiveness of the treatment is ensured by enhancing the ozone concentration of the ozone-containing fluids inside the processing chamber, in either or both gas and liquid phases. The employment of a micro chamber as the processing chamber also helps to reduce the consump-
(Continued)

tion of the treatment gas and liquid, as well as the resulted waste emission.

6 Claims, 12 Drawing Sheets

(51) Int. Cl.
*B08B 3/14* (2006.01)
*H01L 21/67* (2006.01)

(58) Field of Classification Search
CPC ....... B08B 3/08; B08B 3/14; B08B 2203/005; B08B 3/02; B08B 2203/002
USPC .. 134/102.1, 902, 2, 1.3, 30, 26, 28, 36, 10, 134/37, 109, 31; 210/760
See application file for complete search history.

APPARATUS AND METHOD FOR PROCESSING SEMICONDUCTOR WAFER SURFACE WITH OZONE-CONTAINING FLUID

CROSS-REFERENCE TO RELATED APPLICATION

This application is the U.S. national stage application of International Application No. PCT/CN2015/085371, filed on Jul. 29, 2015, which claims the priority benefit of China Patent Application No. 201410401635.2, filed on Aug. 14, 2014. The above-identified patent applications are hereby incorporated by reference in their entirety.

TECHNICAL FIELD

The present disclosure generally relates to a fabrication process of semiconductor materials and, more particularly, to an apparatus and a method for processing a semiconductor wafer surface with one or more ozone-containing fluids.

BACKGROUND

In semiconductor fabrication processes, for purposes of preparing an ultra-clean semiconductor wafer surface, a wafer surface typically undergoes a cleaning process using a wide variety of chemical liquids or gases according to different process requirements. Currently, most of the cleaning processes have still been based on traditional RCA cleaning recipes (referred to as "SC1 and SC2 cleaning solutions"), as well as cleaning solutions formed of a mixture of sulfuric acid and hydrogen peroxide (referred to as "SPM"). The cleaning solution of the mixture of sulfuric acid and hydrogen peroxide is employed not only to remove organic contaminants and photoresists on the wafer surface, but also to generate a thin oxide layer on the wafer surface. The No. 1 cleaning solution (SC1), formed of a mixture of ammonium hydroxide and hydrogen peroxide, is used to remove particles, some organic compounds and some metals on the wafer surface. The No. 2 cleaning solution (SC2), formed of a mixture of hydrochloric acid and hydrogen peroxide, is used to remove metal ions on the wafer surface. RCA cleaning recipes contain hydrogen peroxide which is used in oxidation reactions, whereas the SPM cleaning process consumes a large quantity of concentrated sulfuric acid. Both are to be followed by rising with a large quantity of ultra-pure water. Regardless RCA recipes or SPM, it is environmentally unsound and poses a potential threat to the safety and health of operating personnel involved. Therefore, it is essential to look for a safe, economical and environment-friendly alternative cleaning process and recipe of which a cleaning effect is comparable to or better than that of SPM.

It is well known that ozone gas possesses extremely strong oxidizability. That is, ozone gas is capable of having oxidation-reduction chemical reactions with a plurality of substances, such as organics and silicon. In the oxidation-reduction reactions, ozone gas is reduced to oxygen, which is harmless to humans and environment. Therefore, ozone gas, as well as an ozone aqueous solution formed of a mixture of ozone gas and water, constitute safe, economical and environment-friendly cleaning process and recipe. Although ozone aqueous solution has been studied for the purpose of removal of organic contaminants and photoresists, it has not been widely used. The main obstacle resides in that a concentration of the ozone in chemical reactions is difficult to ensure or control, and thus cannot fulfill processing requirements.

Normally, the dissolved concentration of ozone gas in water follows Henry's law. Namely, a concentration of ozone in liquid phase is proportional to a partial pressure of ozone in gas phase. Therefore, it is necessary to increase the partial pressure of ozone in gas phase in order to obtain an ozone aqueous solution having a high ozone concentration. Existing cleaning equipment, whether based on immersion or spray techniques, prepares an ozone aqueous solution of higher concentration by premixing ozone and water, before treating the wafer surface with the prepared ozone aqueous solution using either a soaking reservoir containing the prepared ozone aqueous solution or a spraying mechanism spraying the prepared ozone aqueous solution onto the wafer surface. Regardless, due to a rather open environment of the existing cleaning equipment, it is difficult to maintain a high ozone concentration in gas phase. Since the partial pressure of ozone in gas phase is relatively low, once the ozone aqueous solution is transferred into the soaking reservoir or sprayed onto the wafer surface, the ozone in the water would immediately start to cross an interface of liquid and gas and escape into the gas phase. Therefore, the ozone concentration in the ozone aqueous solution will reduce rapidly and continuously, thereby negatively influencing the processing effect.

SUMMARY

This section is for the purpose of summarizing some aspects of the present disclosure and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present disclosure.

In order to address the aforementioned problems, the present disclosure provides an apparatus and method for processing a semiconductor wafer surface with one or more fluids containing ozone (i.e., ozone-containing fluids). The apparatus and method not only can improve a processing effectiveness of an ozone-containing fluid on a semiconductor wafer surface, but also can reduce consumptions of the gases and fluids involved, and also decrease waste emissions.

According to one aspect of the present disclosure, an apparatus is disclosed for processing one or more surfaces of a semiconductor wafer with one or more ozone-containing fluids. The apparatus includes an ozone generator, a solvent flask, a gas-liquid mixing device, and a processing chamber capable of receiving the semiconductor wafer. Each of the ozone generator and the solvent flask couples respectively to a corresponding inlet of the gas-liquid mixing device. In addition, the gas-liquid mixing device couples to the processing chamber.

In some embodiments, the apparatus may further include a gas-liquid separation device that is coupled between the gas-liquid mixing device and the processing chamber.

In some embodiments, the apparatus may further include a switching valve that is coupled between the gas-liquid mixing device and the gas-liquid separation device. The switching valve may also be coupled between the gas-liquid separation device and the processing chamber. Also, at least one outlet of the gas-liquid separation device couples to at least one inlet of the gas-liquid mixing device.

In some embodiments, the ozone generator may be a first ozone generator. The solvent flask may be a first solvent flask. The gas-liquid mixing device may be a first gas-liquid mixing device. The gas-liquid separation device may be a first gas-liquid separation device. The switching valve may be a first switching valve. The apparatus may further include a second ozone generator, a second solvent flask, a second gas-liquid mixing device, a second gas-liquid separation device, and a second switching valve. In particular, the second switching valve is coupled between the first switching valve and the first gas-liquid separation device. Each of the second ozone generator and the second solvent flask couples respectively to a corresponding inlet of the second gas-liquid mixing device. The first switching valve is further coupled between the second gas-liquid mixing device and the processing chamber. The second gas-liquid mixing devices couples to the second gas-liquid separation device by coupling to the first switching valve which subsequently couples to the second switching valve which subsequently couples to the second gas-liquid separation device. Also, at least one outlet of the second gas-liquid separation device couples to at least one inlet of the second gas-liquid mixing device.

In some embodiments, the gas-liquid separation device may be a first gas-liquid separation device, while the switching valve as a first switching valve. The apparatus may further include a second gas-liquid separation device and a second switching valve. In particular, the at least one outlet of the first gas-liquid separation device may couple to the at least one inlet of the gas-liquid mixing device by coupling to the second switching valve which subsequently couples to the at least one inlet of the gas-liquid mixing device. In addition, the second gas-liquid separation device couples to the first switching valve and the second switching valve, respectively.

In some embodiments, the apparatus may include another ozone generator coupled to at least one inlet of the processing chamber.

In some embodiments, the processing chamber of the apparatus may include an upper chamber portion and a lower chamber portion corresponding to the upper chamber portion. Either or both of the upper chamber portion and the lower chamber portion comprise at least one inlet configured to allow the one or more ozone-containing fluids to enter the processing chamber and at least one outlet configured to discharge the one or more ozone-containing fluids from the processing chamber.

According to another aspect of the present disclosure, a method for processing one or more surfaces of a semiconductor wafer is disclosed. The method involves transferring ozone gas generated by an ozone generator and a solvent stored in a solvent flask into a gas-liquid mixing device, respectively. The method also involves mixing, by the gas-liquid mixing device, the ozone gas with the solvent to obtain a mixed fluid containing the ozone gas and an ozone solution. The method also involves transferring at least a part of the mixed fluid into a processing chamber housing the semiconductor wafer to process the one or more surfaces of the semiconductor wafer with the mixed fluid.

In some embodiments, at least a part of the mixed fluid includes the ozone solution. In addition, after the mixing of the ozone gas and the solvent and before the transferring of the at least a part of the mixed fluid into the processing chamber, the method further involves separating, by a gas-liquid separation device, the ozone solution from the mixed fluid.

In some embodiments, wherein the ozone generator is a first ozone generator, the method may further involves transferring, during the transferring of the at least a part of the mixed fluid into the processing chamber, ozone gas generated by a second ozone generator into the processing chamber.

In some embodiments, after the mixing of the ozone gas and the solvent and before the transferring of the at least a part of the mixed fluid into the processing chamber, the method may further involves enhancing an ozone concentration of the ozone gas of the mixed fluid, an ozone concentration of the ozone solution of the mixed fluid, or both, by circulating at least a part of the mixed fluid between the gas-liquid mixing device and a gas-liquid separation device.

In some embodiments, the enhancing of the ozone concentration of the ozone gas of the mixed fluid, the ozone concentration of the ozone solution of the mixed fluid, or both may involve separating, by the gas-liquid separation device, the ozone solution from the mixed fluid, as well as mixing, by the gas-liquid mixing device, the ozone solution with the ozone gas generated by the ozone generator.

In some embodiments, the transferring of the at least a part of the mixed fluid into the processing chamber may involve transferring both the ozone gas and the ozone solution of the mixed fluid from the gas-liquid mixing device into the processing chamber.

In some embodiments, the transferring of the at least a part of the mixed fluid into the processing chamber involves transferring the ozone solution of the mixed fluid from the gas-liquid separation device into the processing chamber.

BRIEF DESCRIPTION OF THE DRAWINGS

These and other features, aspects, and advantages of the present disclosure will become better understood with regard to the following description, appended claims, and accompanying drawings where:

DETAILED DESCRIPTION OF THE PREFERRED EMBODIMENTS

The detailed description of the present disclosure is presented largely in terms of procedures, steps, logic blocks, processing, or other symbolic representations that directly or indirectly resemble the operations of devices or systems contemplated in the present disclosure. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be comprised in at least one embodiment of the present disclosure. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or the use of sequence numbers representing one or more embodiments of the present disclosure do not inherently indicate any particular order nor imply any limitations in the present disclosure.

To make the above objects, features and advantages of the present disclosure more obvious and easier to understand, the present disclosure is further described in detail below using various embodiments.

The present disclosure provides an apparatus for processing a semiconductor wafer surface with one or more ozone-containing fluids. The apparatus is capable of chemically treating a surface of not only a semiconductor wafer, but also other solid materials or objects.

Figure 1:
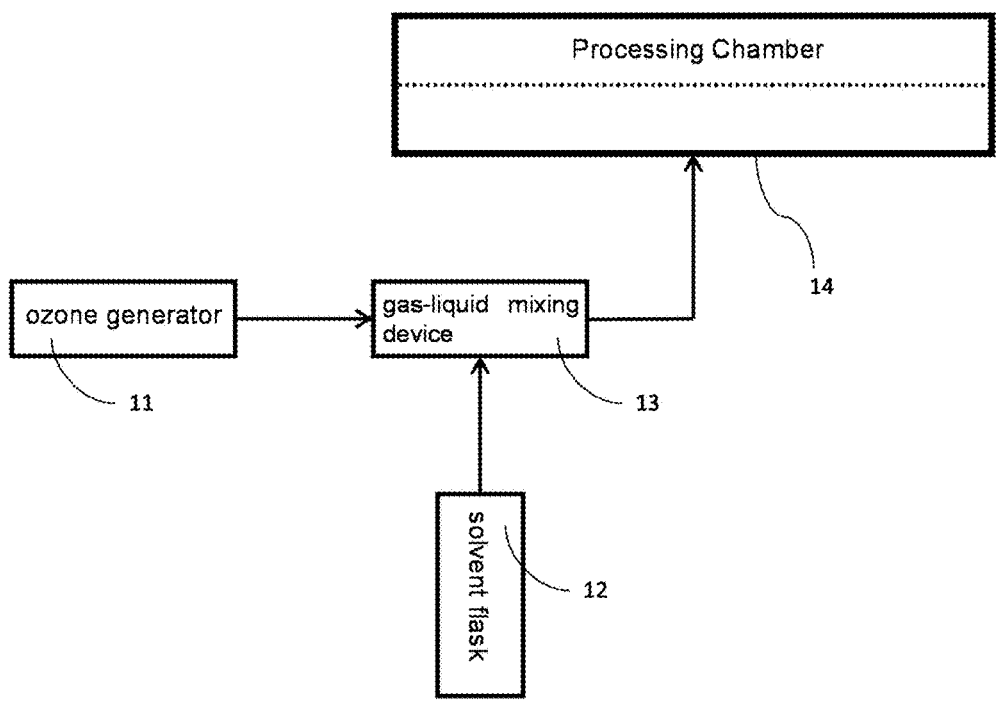
FIG. 1 is a structure diagram of an apparatus in a first embodiment of the present disclosure.
Figure 2:
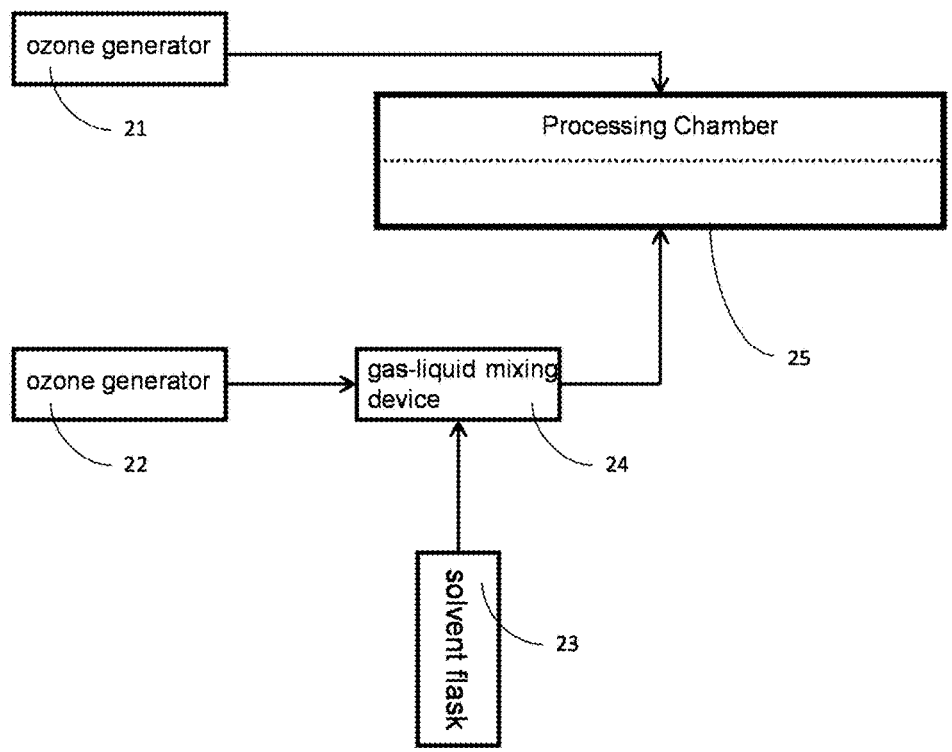
FIG. 2 is a structure diagram of an apparatus in a second embodiment of the present disclosure.

FIG. 1 is a structure diagram of an apparatus in a first example of the present disclosure. The apparatus includes an ozone generator 11, a solvent flask 12, a gas-liquid mixing device 13, and a processing chamber 14. In some embodiments, the apparatus may also include a gas-liquid delivery system and a gas-liquid discharge system (not shown). The ozone generator 11 and the solvent flask 12 are coupled to corresponding inlets of the gas-liquid mixing device 13, respectively, and one or more outlets of the gas-liquid mixing device 13 are coupled to at least one inlet of the processing chamber 14. When the apparatus is employed to process a semiconductor wafer, ozone gas generated by the ozone generator 11 and the solvent stored in the solvent flask 12 are transferred into the gas-liquid mixing device 13, respectively. The ozone gas and the solvent are then mixed by the gas-liquid mixing device 13 to obtain a mixed fluid containing ozone gas and a solvent that contains ozone (i.e., an ozone solution). The mixed fluid is subsequently sent into the processing chamber 14, where one or more oxidation-reduction chemical reactions occur between the mixed fluid and one or more surfaces of the semiconductor water housed inside the closed chamber 14. The oxidation-reduction chemical reactions with the wafer surface(s) may be enabled to occur by ozone remaining in the gas phase of the mixed fluid, by ozone remaining in the liquid phase of the mixed fluid, by chemical substances produced when the ozone gas is mixed with the solvent, or a combination of two or more thereof. It is to be noted that, the processing chamber 14 provides a sealed or essentially closed environment for the chemical reactions. While the ozone in the gas phase of the mixed fluid is kept within the sealed environment, the partial pressure of the ozone content in the gas phase in the processing chamber 14 may be relatively enhanced. The enhanced partial pressure of ozone in the gas phase would suppress the ozone in the ozone solution from escaping from the liquid phase to the gas phase, thereby ensuring a higher ozone concentration in the ozone solution. The enhanced partial pressure of ozone in the gas phase, and/or the higher ozone concentration in the ozone solution, may meet the processing requirements in a preferable way. It is also to be noted that, ozone is easily decomposed into oxygen, with a rather short half-life period of roughly 20-120 minutes. Therefore, it is crucial to shorten as much as possible a time duration between a time when the ozone is generated and a time the ozone is consumed. It follows that the transmission distance between the ozone generator 11 and the processing chamber 14 may be shortened, ensuring the enhanced concentration of ozone in the gas phase as well as the higher ozone concentration in the ozone solution, so as to improve a processing effectiveness of the mixed fluid toward the wafer. Furthermore, while the mixed fluid is sent into the processing chamber 14, an additional ozone generator may be employed, and ozone generated by the additional ozone generator may be transferred directly into the processing chamber. This improves the gas-phase partial pressure of ozone inside the processing chamber, and the escape of ozone from the liquid phase of the mixed fluid (i.e., the ozone solution) may be further suppressed. FIG. 2 illustrates a structure diagram of an apparatus in a second example of the present disclosure, which has an additional ozone generator. FIG. 2 includes an ozone generator 21, an ozone generator 22, a solvent flask 23, a gas-liquid mixing device 24 and a processing chamber 25. Other components of the apparatus and the method for processing a wafer with the apparatus are similar to those of the first example of the present disclosure, and therefore the detailed description thereof is not repeated.

One emphasis, advantage or benefit of the present disclosure is that: the ozone solution, ozone gas, and thus the mixed fluid containing both, are all generated in-situ and transferred into the processing chamber via pipelines in real time, thus inhibiting decomposition of ozone to oxygen.

Figure 3:
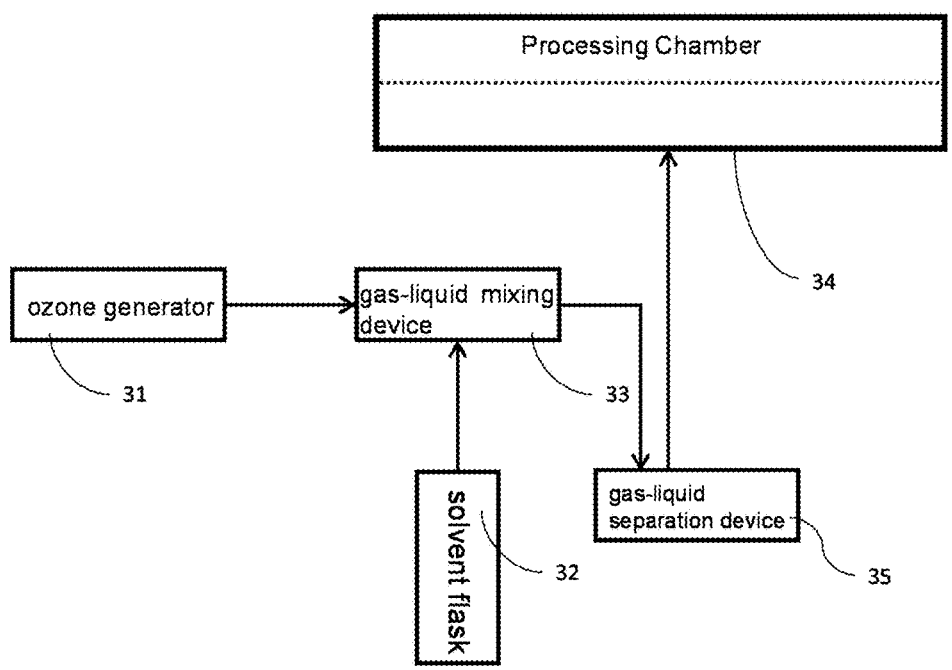
FIG. 3 is a structure diagram of an apparatus in a third embodiment of the present disclosure.

In some embodiments, the process requires to treat a surface of a semiconductor wafer with ozone solution(s) but not with ozone gas, for which case a gas-liquid separation device may be employed. The gas-liquid separation device may separate ozone gas and an ozone solution, and then the ozone solution may be transferred into the processing chamber. FIG. 3 illustrates a structure diagram of an apparatus in a third example of the present disclosure, which includes a gas-liquid separation device. The apparatus includes an ozone generator 31, a solvent flask 32, a gas-liquid mixing device 33, a processing chamber 34, and a gas-liquid separation device 35. In some embodiments, the apparatus may also include a gas-liquid delivery system and a gas-liquid discharge system (not shown). The ozone generator 31 and the solvent flask 32 are coupled to corresponding inlets of the gas-liquid mixing device 33, respectively, and one or more outlets of the gas-liquid mixing device 33 are coupled to at least one inlet of the gas-liquid separation device 35. In addition, at least one outlet of the gas-liquid separation device 35 is coupled to at least one inlet of the processing chamber 34. When the apparatus is employed to process a semiconductor wafer, ozone gas generated by the ozone generator 31 and the solvent stored in the solvent flask 32 are transferred into the gas-liquid mixing device 33, respectively. The ozone gas and the solvent are then mixed by the gas-liquid mixing device 33 to obtain a mixed fluid containing ozone gas and a solvent that contains ozone (i.e., an ozone solution). The mixed fluid is subsequently sent into the gas-liquid separation device 35, which separates the ozone gas and the ozone solution. The ozone solution is then sent into the processing chamber 34 for treating one or more surfaces of the semiconductor wafer housed inside the processing chamber 34. It is to note that ozone in the gas phase inside the processing chamber 34, which is released from the ozone solution inside the processing chamber 34, is kept within the sealed environment, and thus has a higher content as compared to that the in the ambient atmosphere. Consequently, the partial pressure of the ozone content in the gas phase in the processing chamber 34 may be relatively enhanced, which may meet the processing requirements in a preferable way.

Figure 4:
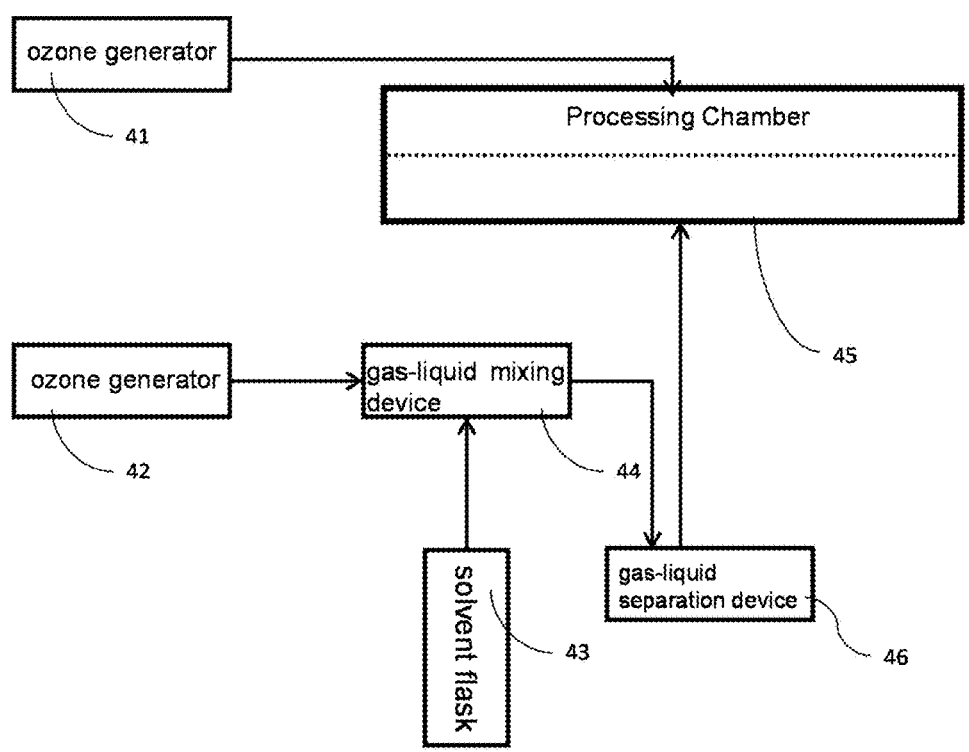
FIG. 4 is a structure diagram of an apparatus in a fourth embodiment of the present disclosure.

Similar to what is presented above in FIG. 2, while the ozone solution is sent into the processing chamber 34, an additional ozone generator may be employed, and ozone generated by the additional ozone generator may be transferred directly into the processing chamber. This improves the gas-phase partial pressure of ozone inside the processing chamber, and the escape of ozone from the liquid phase of the ozone solution may be further suppressed. FIG. 4 illustrates a structure diagram of an apparatus in a fourth example of the present disclosure. FIG. 4 includes an ozone generator 41, an ozone generator 42, a solvent flask 43, a gas-liquid mixing device 44, a processing chamber 45 and a gas-liquid separation device 46. Other components of the apparatus and the method for processing a wafer with the apparatus are similar to those of the third example of the present disclosure, and therefore the detailed description thereof is not repeated.

Figure 5:
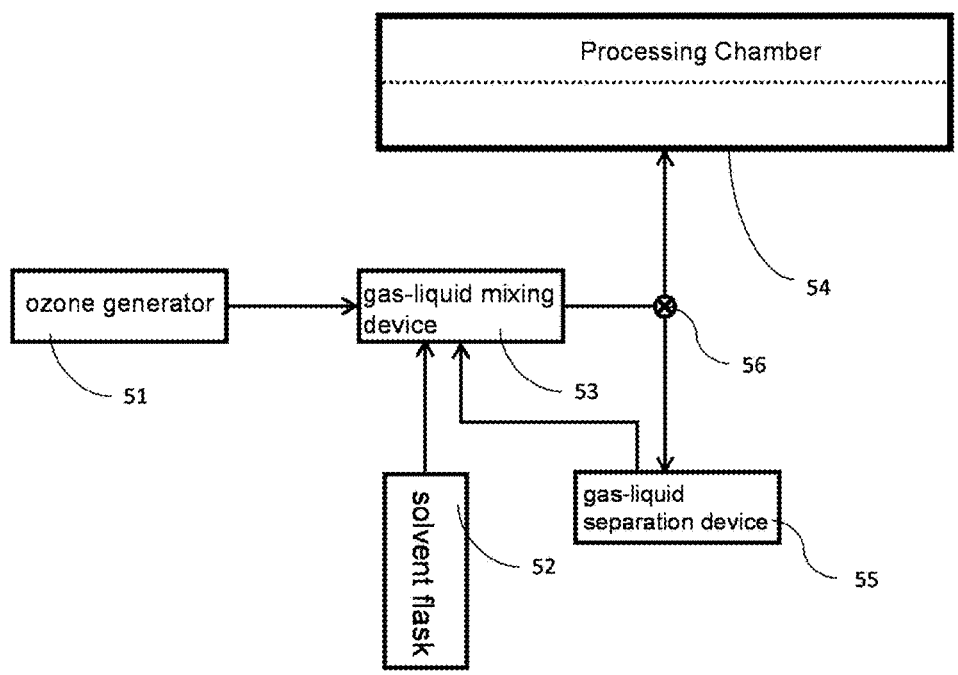
FIG. 5 is a structure diagram of an apparatus in a fifth embodiment of the present disclosure.

In some embodiments, a higher ozone concentration of the mixed fluid may be achieved by repeating a process of mixing ozone gas with the mixed fluid. This may be realized through switching fluid lines of an apparatus using a switching valve. A wafer housed in the processing chamber may then be treated on one or more surfaces of the wafer with the mixed fluid having the higher ozone concentration. Alternatively, the ozone solution of the mixed fluid having the higher ozone concentration may be separated from the mixed fluid by a gas-fluid separation device and then sent to the processing chamber for treating the wafer surface(s). FIG. 5 illustrates a structure diagram of an apparatus in a fifth example of the present disclosure. The apparatus includes an ozone generator 51, a solvent flask 52, a gas-liquid mixing device 53, a processing chamber 54, a gas-liquid separation device 55, and a switching valve 56. In some embodiments, the apparatus may also include a gas-liquid delivery system and a gas-liquid discharge system (not shown). The ozone generator 51 and the solvent flask 52 are coupled to corresponding inlets of the gas-liquid mixing device 53, respectively. The three ports of the switching valve 56 are coupled to the gas-liquid mixing device 53, the processing chamber 54 and the gas-liquid separation device 55, respectively. In addition, at least one outlet of the gas-liquid separation device 55 is coupled to at least one inlet of the gas-liquid mixing device 53. When the apparatus is employed to process a semiconductor wafer, ozone gas generated by the ozone generator 51 and the solvent stored in the solvent flask 52 are transferred into the gas-liquid mixing device 53. The ozone gas and the solvent are then mixed by the gas-liquid mixing device 53 to obtain a mixed fluid containing ozone gas and a solvent that contains ozone (i.e., an ozone solution). The mixed fluid is then transferred, through switching the switching valve 56, into the gas-liquid separation device 55, which separates the ozone gas and the ozone solution. The ozone solution is then sent back into the gas-liquid mixing device 53 once again to further mix with the ozone gas from ozone generator 51, so as to enhance the ozone concentration of the mixed fluid. The mixed fluid and the ozone solution of the mixed fluid may be repeatedly circulated between the gas-liquid mixing device 53 and the gas-liquid separation device 55 until the ozone concentration of the mixed fluid reaches a desired level, and then all or part of the mixed fluid may be sent, via different lines determined by switching the switching valve 56, into the processing chamber 54 for treating the surface(s) of the wafer housed inside the processing chamber 54. In particular, the mixed fluid, now having the desired level of ozone concentration, may be sent from the gas-liquid mixing device 53, via switching valve 56, into the processing chamber 54. Alternatively, the mixed fluid, now having the desired level of ozone concentration, may go through the gas-liquid separation device 55 one more time to separate the ozone gas and the ozone solution, after which only the ozone solution is sent into the processing chamber 54 via switching valve 56.

Figure 6:
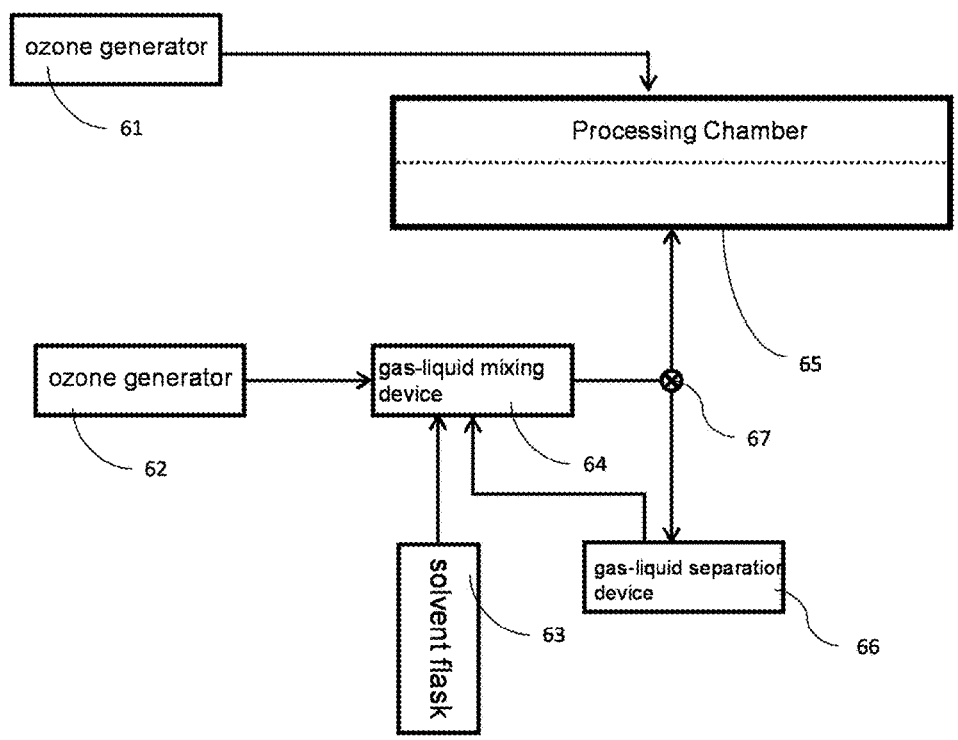
FIG. 6 is a structure diagram of an apparatus in a sixth embodiment of the present disclosure.

Similar to what is presented above in FIGS. 2 and 4, while the mixed fluid or the ozone solution is sent into the processing chamber 54, an additional ozone generator may be employed, and ozone generated by the additional ozone generator may be transferred directly into the processing chamber. This improves the gas-phase partial pressure of ozone inside the processing chamber, and the escape of ozone from the liquid phase may be further suppressed. FIG. 6 illustrates a structure diagram of an apparatus in a sixth example of the present disclosure. FIG. 6 includes an ozone generator 61, an ozone generator 62, a solvent flask 63, a gas-liquid mixing device 64, a processing chamber 65, a gas-liquid separation device 66 and a switching valve 67. Other components of the apparatus and the method for processing a wafer with the apparatus are similar to those of the fifth example of the present disclosure, and therefore the detailed description thereof is not repeated.

Figure 7:
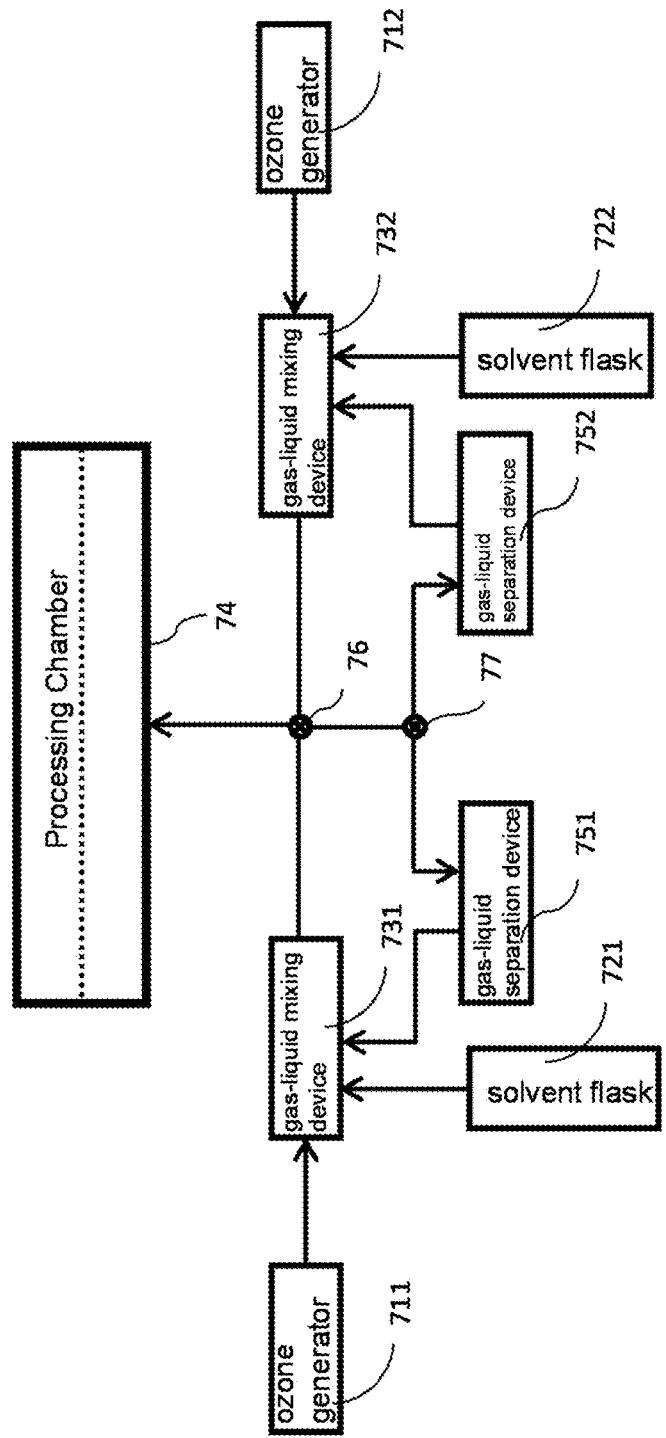
FIG. 7 is a structure diagram of an apparatus in a seventh embodiment of the present disclosure.

In some embodiments, a higher ozone concentration of the mixed fluid may be obtained by adding another set of equipment that produces the mixed fluid. The additional set of equipment may be used alternately with the existing set of equipment to supply the mixed fluid or ozone solution to the processing chamber for treating wafer surface(s). FIG. 7 illustrates a structure diagram of an apparatus in a seventh example of the present disclosure. The apparatus includes an ozone generator 711, a solvent flask 721, a gas-liquid mixing device 731, a processing chamber 74, a gas-liquid separation device 751, a first switching valve 76, a second switching valve 77, an ozone generator 712, a solvent flask 722, a gas-liquid mixing device 732, and a gas-liquid separation device 752. In some embodiments, the apparatus may also include a gas-liquid delivery system and a gas-liquid discharge system (not shown). The ozone generator 711 and the solvent flask 721 are coupled to corresponding inlets of the gas-liquid mixing device 731, respectively. The ozone generator 712 and the solvent flask 722 are coupled to the corresponding inlets of the gas-liquid mixing device 732, respectively. The four ports of the first switching valve 76 are coupled to the gas-liquid mixing device 731, the processing chamber 74, the gas-liquid mixing devices 732 and the second switching valve 77, respectively. The three ports of the second switching valve 77 are coupled to the first switching valve 76, the gas-liquid separation device 751 and the gas-liquid separation device 752, respectively. When the apparatus is employed to process a semiconductor wafer, ozone gas generated by the ozone generator 711 and the solvent stored in the solvent flask 721 are transferred into the gas-liquid mixing device 731. The ozone gas and the solvent are then mixed by the gas-liquid mixing device 731 to obtain a mixed fluid containing ozone gas and a solvent that contains ozone (i.e., an ozone solution). The first switching valve 76 and the second switching valve 77 may be switched such that mixed fluid is then transferred, through the first switching valve 76 and the second switching valve 77, into the gas-liquid separation device 751, which separates the ozone gas and the ozone solution. The ozone solution is then sent back into the gas-liquid mixing device 731 once again so as to enhance the ozone concentration of the mixed fluid. The mixed fluid may be repeatedly circulated between the gas-liquid mixing device 731 and the gas-liquid separation device 751 until the ozone concentration of the mixed fluid reaches a desired level, and then the mixed fluid may be sent, by switching the first switching valve 76, into the processing chamber 74 for treating surface(s) of the wafer housed inside the processing chamber 74. Meanwhile, ozone gas generated by the ozone generator 712 and the solvent stored in the solvent flask 722 are transferred into the gas-liquid mixing device 732. The ozone gas and the solvent are then mixed by the gas-liquid mixing device 732 to obtain a mixed fluid containing ozone gas and a solvent that contains ozone (i.e., an ozone solution). The first switching valve 76 and the second switching valve 77 may be switched such that mixed fluid is then transferred, through the first switching valve 76 and the second switching valve 77, into the gas-liquid separation device 752. With a similar process to that of the gas-liquid mixing device 731 and the gas-liquid separation device 751, the ozone concentration of the mixed fluid circulated between the gas-liquid mixing device 732 and the gas-liquid separation device 752 can also be enhanced. As soon as the mixed fluid in the gas-liquid mixing device 731 is exhausted, the first switching valve 76 and the second switching valve 77 may be switched such that the mixed fluid that has been prepared by the gas-liquid mixing device 732 and the gas-liquid separation device 752 is sent into the processing chamber 74 for treating surface(s) of the wafer positioned inside the processing chamber 74. While the processing chamber 74 is being supplied by the mixed fluid prepared by the gas-liquid mixing device 732 and the gas-liquid separation device 752, the gas-liquid mixing device 731 and the gas-liquid mixing device 731 circulate once again to prepare new mixed fluid having high ozone concentration. It is to be noted that ozone in the gas phase of the mixed fluid inside the processing chamber 74 is kept within a sealed environment, and thus has a higher content as compared to that the in the ambient atmosphere. Consequently, the partial pressure of the ozone content in the gas phase in the processing chamber 74 may be relatively enhanced, which would suppress the ozone in the ozone solution from escaping from the liquid phase to the gas phase, thereby ensuring a higher ozone concentration in the ozone solution, and thus meeting the processing requirements in a preferable way. It is also to be noted that, the aforementioned apparatus employs two sets of equipment for alternately preparing the ozone-containing mixed fluid having higher ozone concentration and sending the mixed fluid to the processing chamber for treating wafer surface(s). That is, while a first pair of gas-liquid mixing device and has-liquid separation device are circulating mixed fluid for enhancing ozone concentration thereof, a second pair of gas-liquid mixing device and has-liquid separation device are supplying mixed fluid that has been prepared to the processing chamber. The two sets of equipment alternate such that mixed fluid of high ozone concentration can be continuously supplied to the processing chamber. This may save process time and meet process requirements.

Figure 8:
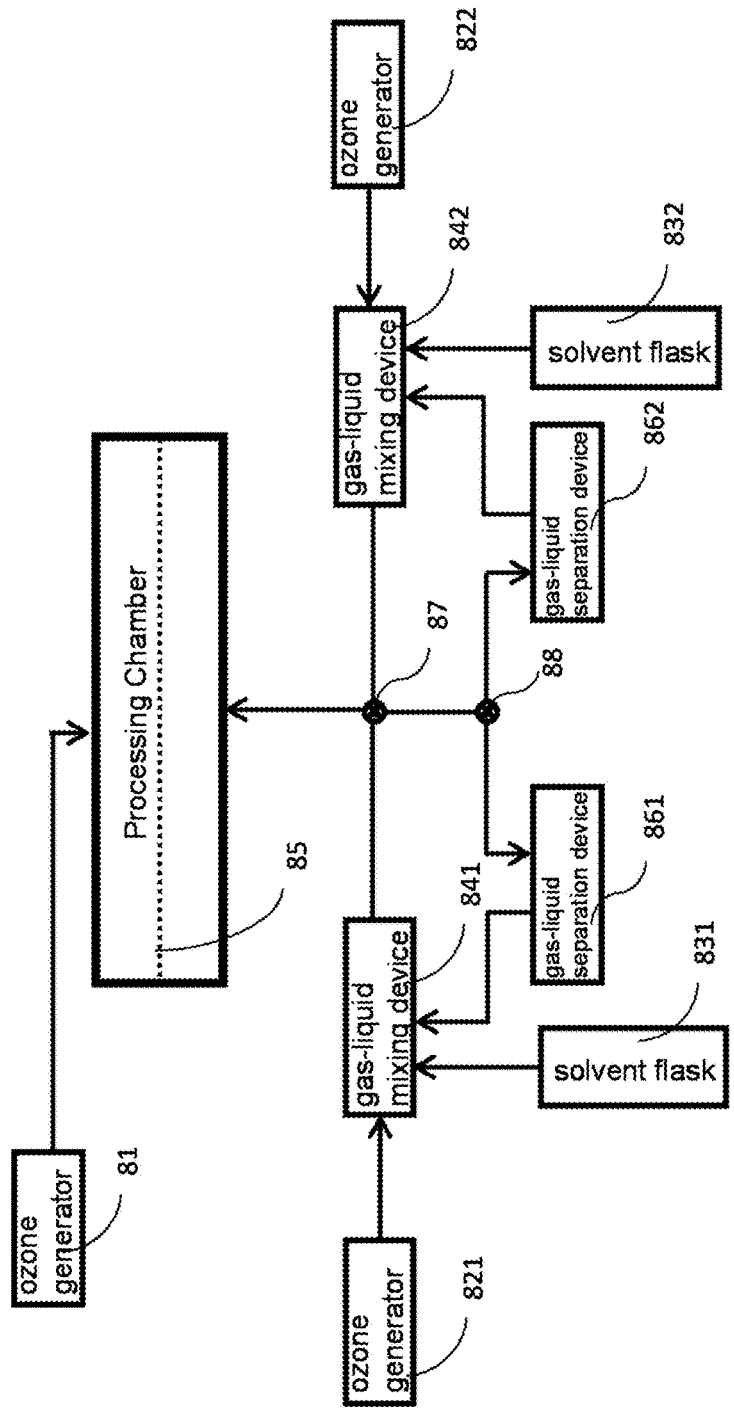
FIG. 8 is a structure diagram of an apparatus in an eighth embodiment of the present disclosure.

Similar to what is presented above in FIGS. 2, 4 and 6, while the mixed fluid is sent into the processing chamber 74, an additional ozone generator may be employed, and ozone generated by the additional ozone generator may be transferred directly into the processing chamber. This improves the gas-phase partial pressure of ozone inside the processing chamber, and the escape of ozone from the liquid phase of the ozone solution may be further suppressed. FIG. 8 illustrates a structure diagram of an apparatus in an eighth example of the present disclosure. FIG. 8 includes an ozone generator 81, an ozone generator 821, a solvent flask 831, a gas-liquid mixing device 841, a processing chamber 85, a gas-liquid separation device 861, a first switching valve 87, a second switching valve 88, an ozone generator 822, a solvent flask 832, a gas-liquid mixing device 842 and a gas-liquid separation device 862. Other components of the apparatus and the method for processing a wafer with the apparatus are similar to those of the seventh example of the present disclosure, and therefore the detailed description thereof is not repeated.

Figure 9:
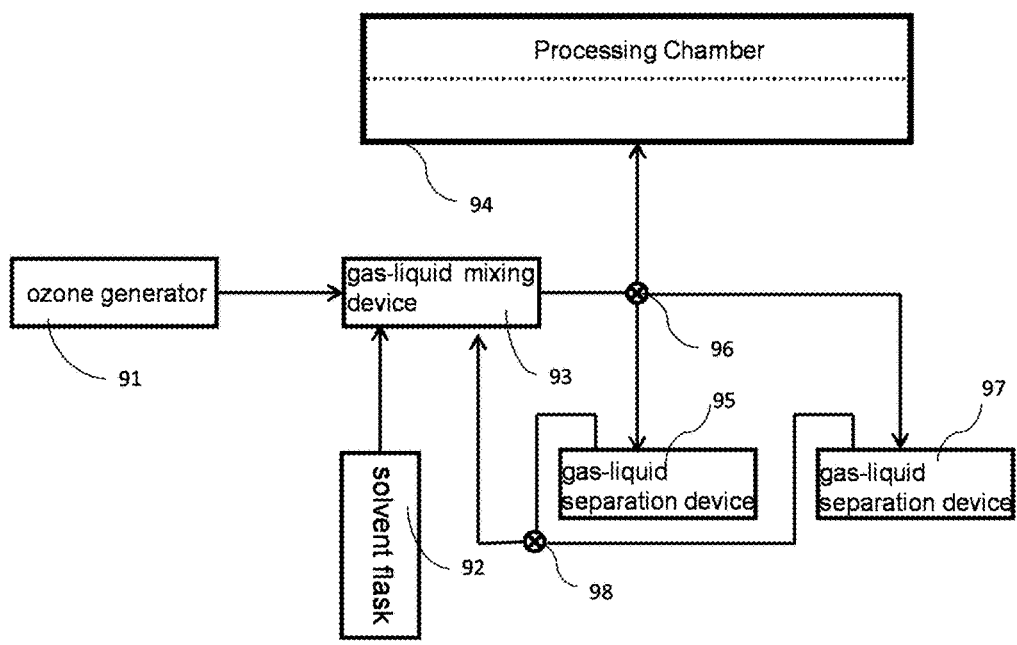
FIG. 9 is a structure diagram of an apparatus in a ninth embodiment of the present disclosure.

In some embodiments, a higher ozone concentration of ozone solution may be obtained by adding another gas-liquid separation device. The additional gas-liquid separation device may be used alternately with the existing gas-liquid separation device to supply the ozone solution to the processing chamber for treating wafer surface(s). FIG. 9 illustrates a structure diagram of an apparatus in a ninth example of the present disclosure. The apparatus includes an ozone generator 91, a solvent flask 92, a gas-liquid mixing device 93, a processing chamber 94, a first gas-liquid separation device 95, a first switching valve 96, a second gas-liquid separation device 97, and a second switching valve 98. In some embodiments, the apparatus may also include a gas-liquid delivery system and a gas-liquid discharge system (not shown). The ozone generator 91 and the solvent flask 92 are coupled to corresponding inlets of the gas-liquid mixing device 93, respectively. The four ports of the first switching valve 96 are coupled to the gas-liquid mixing device 93, the processing chamber 94, the first gas-liquid separation device 95 and the second gas-liquid separation device 97, respectively. The three ports of the second switching valve 98 are coupled to the gas-liquid mixing device 93, the first gas-liquid separation device 95 and the second gas-liquid separation device 97, respectively. When the apparatus is employed to process a semiconductor wafer, ozone gas generated by the ozone generator 91 and the solvent stored in the solvent flask 92 are transferred into the gas-liquid mixing device 93. The ozone gas and the solvent are then mixed by the gas-liquid mixing device 93 to obtain a mixed fluid containing ozone gas and a solvent that contains ozone. The first switching valve 96 may be switched such that the mixed fluid is then transferred, through the first switching valve 96, into the first gas-liquid separation device 95, which separates the ozone gas and the ozone solution. The second switching valve 98 may then be switched such that ozone solution is sent, through the second switching valve 98, back into the gas-liquid mixing device 93 once again so as to enhance the ozone concentration of the mixed fluid. When the ozone concentration of the mixed fluid reaches a desired level, the mixed fluid may be sent to the first gas-liquid separation device 95 once more for separating the ozone gas and the ozone solution. The first switching valve 96 may then be switched to enable the ozone solution to be sent from the first gas-liquid separation device 95 into the processing chamber 94 for treating surface(s) of the wafer housed inside the processing chamber 94. Meanwhile, the gas-liquid mixing device 93 may continue to mix the ozone gas from the ozone generator 91 and the solvent from the solvent flask 92 to obtain mixed fluid having ozone gas and ozone solution. The mixed fluid may then be sent, via the first switching valve 96, to the second gas-liquid separation device 97, which separates the ozone gas and ozone solution. The second switching valve 98 may then be switched such that ozone solution is sent, from the second gas-liquid separation device 97 and through the second switching valve 98, back into the gas-liquid mixing device 93 once again so as to enhance the ozone concentration of the mixed fluid. The ozone concentration may be further enhanced by repeatedly circulating the mixed fluid between the gas-liquid mixing device 93 and the second gas-liquid separation device 97. As soon as the ozone solution from the first gas-liquid separation device 95 is exhausted, the first switching valve 96 may be switched such that the ozone solution from the second gas-liquid separation device 97 is sent into the processing chamber 94. Meanwhile, the gas-liquid mixing device 93 may produce new mixed fluid, which is circulated between the gas-liquid mixing device 93 and the first gas-liquid separation device 95 to prepare new mixed fluid of high ozone concentration, as well as new ozone solution of high ozone concentration (i.e., the high-concentration ozone solution). It is to be noted that ozone in the gas phase of the ozone solution inside the processing chamber 94 is kept within a sealed environment, and thus has a higher content as compared to that in the ambient atmosphere. Consequently, the partial pressure of the ozone content in the gas phase in the processing chamber 94 may be relatively enhanced, which would suppress the ozone in the ozone solution from escaping from the liquid phase to the gas phase, thereby ensuring a higher ozone concentration in the ozone solution, and thus meeting the processing requirements in a preferable way. It is also to be noted that, the aforementioned apparatus employs two gas-liquid separation devices for alternately preparing the high-concentration ozone solution along with the gas-liquid mixing device and sending the high-concentration ozone solution to the processing chamber for treating wafer surface(s). That is, while a first gas-liquid separation device is circulating with the gas-liquid mixing device for enhancing ozone concentration of the ozone solution, a second gas-liquid separation device is supplying the high-concentration ozone solution that has been prepared to the processing chamber. The two gas-liquid separation devices alternate such that the ozone solution of high ozone concentration can be continuously supplied to the processing chamber. This may save process time and meet process requirements.

Figure 10:
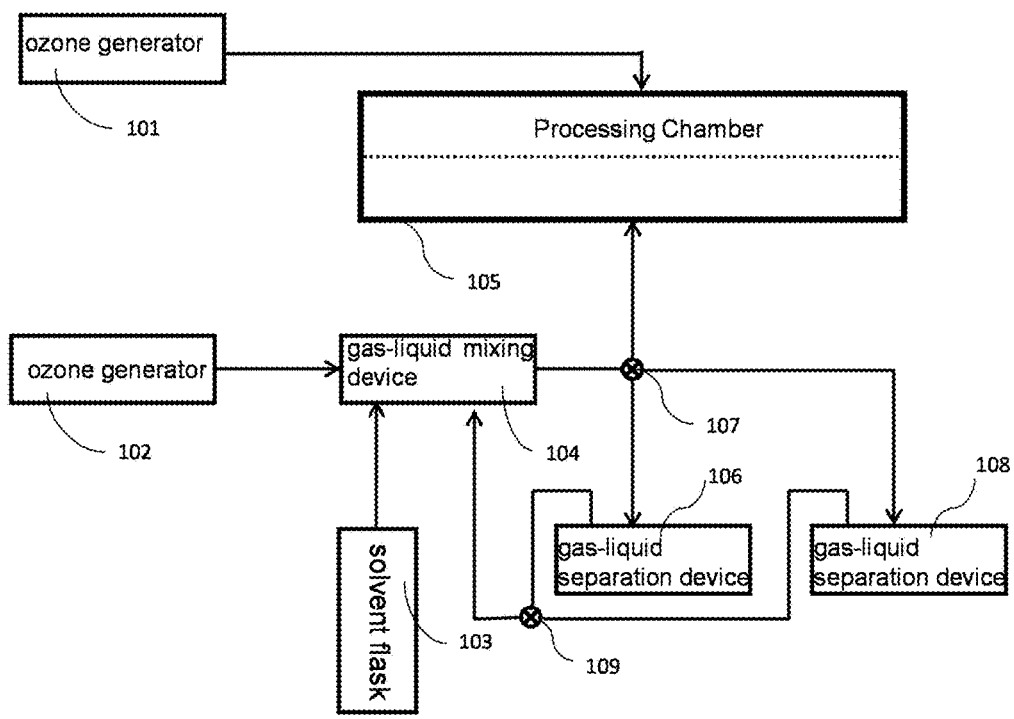
FIG. 10 is a structure diagram of an apparatus in a tenth embodiment of the present disclosure.

Similar to what is presented above, while the mixed fluid is sent into the processing chamber 94, an additional ozone generator may be employed, and ozone generated by the additional ozone generator may be transferred directly into the processing chamber. This improves the gas-phase partial pressure of ozone inside the processing chamber, and the escape of ozone from the liquid phase of the ozone solution may be further suppressed. FIG. 10 illustrates a structure diagram of an apparatus in a tenth example of the present disclosure. FIG. 10 includes an ozone generator 101, an ozone generator 102, a solvent flask 103, a gas-liquid mixing device 104, a processing chamber 105, a first gas-liquid separation device 106, a first switching valve 107, a second gas-liquid separation device 108 and a second switching valve 109. Other components of the apparatus and the method for processing a wafer are similar to those of the ninth example of the present disclosure and therefore the detailed description thereof is not repeated.

Figure 11:
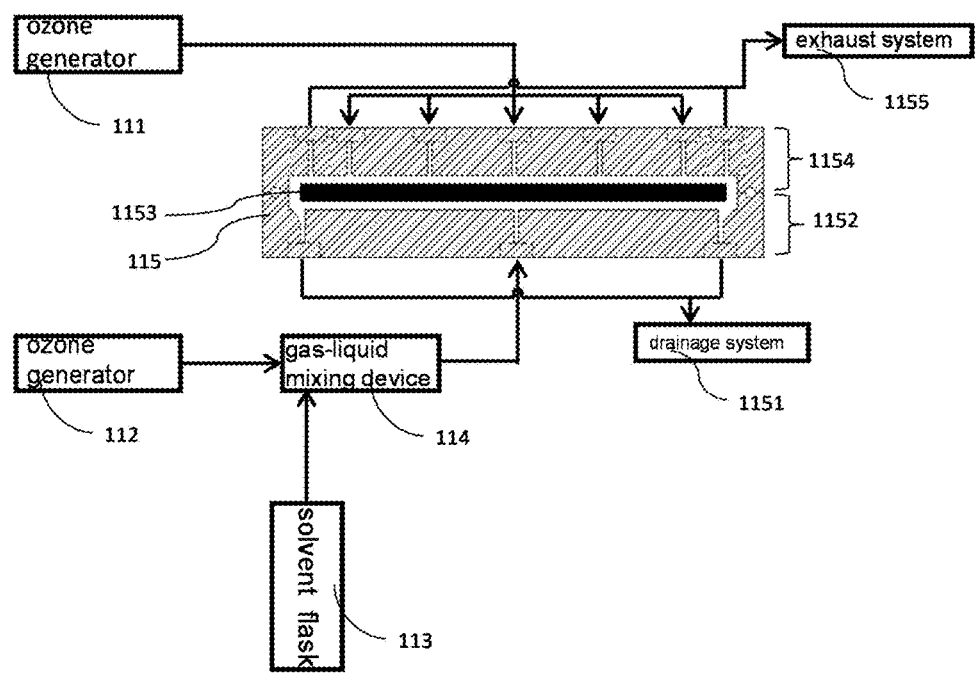
FIG. 11 is a structure diagram of an apparatus in an embodiment of the present disclosure.

In some embodiments, the processing chamber is designed as a micro processing chamber that includes an upper chamber portion and a lower chamber portion corresponding to the upper chamber portion. Either or both of the upper chamber portion and the lower chamber portion include at least one inlet configured to allow the processing fluid to enter the processing chamber and at least one outlet configured to allow the processing fluid to be discharged from the processing chamber. FIG. 11 illustrates a structure diagram of an apparatus in an embodiment of the present invention. FIG. 11 includes an ozone generator 111, an ozone generator 112, a solvent flask 113, a gas-liquid mixing device 114 and a micro processing chamber 115. The micro processing chamber 115 in the apparatus includes an upper chamber portion 1154 and a lower chamber portion 1152 corresponding to one another. The upper chamber portion 1154 is arranged with an exhaust system 1155 and the lower chamber portion 1152 is arranged with a drainage system 1151. A wafer 1153 may be placed in the processing chamber that includes the upper chamber portion 1154 and the lower chamber portion 1152. Other components of the apparatus and the method for processing the wafer are similar to those of the second example of the present disclosure, and therefore the detailed description thereof is not repeated. The upper chamber portion and the lower chamber portion are relatively movable between an open position and a closed position. When the upper chamber portion and the lower chamber portion are in the closed position, the upper chamber portion and the lower chamber portion are closed with one another to form a microcavity that is able to receive the wafer. A gap may exist between the wafer and a lower surface of the upper chamber portion facing the microcavity, and a gap may exist between the wafer and an upper surface of the lower chamber portion facing the microcavity. The height of the gap usually ranges from 0.01 mm to 10 mm. The space inside the micro processing chamber is very small, and thus the ozone concentration of the ozone-containing mixed fluid, either in the gas phase or the liquid phase, may be ensured inside the micro processing chamber. In addition, the mixed fluid may flow inside the micro processing chamber flow outwardly along one or more surfaces of the wafer. Therefore, ozone and other chemical substances, regardless in gas phase or liquid phase of the mixed fluid, may react with the surfaces of the wafer.

Depending on specific process requirements, the solvents in the solvent flask of the present disclosure may be an organic solution or an inorganic solution, such as ultrapure water, hydrofluoric acid-containing solutions, acetic acids, acetone, etc.

The gas-liquid mixing device of the present disclosure may be any known device that suffices the purpose, such as a jet device or a gas-liquid mixing pump.

The gas-liquid separation device of the present disclosure may include a container for storing the ozone solution.

The ozone or the ozone solution produced in the present disclosure may replace a plurality of conventional wafer cleaning solutions.

For example, a conventional SPM solution (i.e., the so-called "No. 3 solution") consists of $H_2SO_4$, $H_2O_2$ and $H_2O$, and may function to remove 1) organic contaminants, and 2) some metal contaminants. A problem of SPM solution resides in that there may be residual sulfides left on the surface of the silicon wafer after the wafer is cleaned using SPM solution, especially if the wafer is heavily contaminated by organic contaminants. The residual sulfides are very difficult to be removed by water. According to the present disclosure, the solution in the solvent flask may be a $H_2O_2$ aqueous solution, and thus the ozone-containing mixed fluid produced by the gas-liquid mixing device may contain both ozone and $H_2O_2$. The mixed fluid, while having no sulfuric acid substances, may replace the No. 3 solution and remove organic matters by the oxidation ability of ozone without leaving hard-to-dissolve sulfides on the wafer surface. In some embodiments, only water is present in the solvent flask, and thus the ozone-containing mixed fluid produced by the gas-liquid mixing device may contain ozone. The mixed fluid may replace the No. 3 solution and remove organic matters by the oxidation ability of ozone.

As another example, a conventional APM solution (i.e., the so-called "SC1", or "No. 1 solution") consists of $NH_4OH$, $H_2O_2$ and $H_2O$, and may function to remove 1) particles, 2) some organic matters, and 3) some metals. area problem of APM solution resides in that: 1) APM solution may increase the roughness of the silicon wafer surface, and 2) metals such as Fe, Zn and Ni may attach to the silicon wafer surface in the form of ionic or non-ionic metal hydroxides. According to the present disclosure, the solution in a solvent flask may be a $NH_4OH$ aqueous solution. The mixed fluid produced by the gas-liquid may contain ozone and $NH_4OH$, which may replace No. 1 solution and more thoroughly remove particles, organic contaminants and metal contaminants by the oxidation ability while decreasing the roughness of the silicon wafer surface. The generation of hydroxide of Zn, Ni, Fe and other metal may be reduced or avoided by adjusting the concentration of $NH_4OH$.

As yet another example, a conventional HPM solution (i.e., the so-called "SC2", or "No. 2 solution") consists of HCl, $H_2O_2$ and $H_2O$, and may function to remove metal contaminants. A problem of HPM solution resides in that the HPM solution cannot effectively remove Al metal. According to the present disclosure, the solution in the solvent flask may be a HCl aqueous solution. The mixed fluid produced by the gas-liquid mixing device may contain ozone and HCl, and may replace No. 2 solution to more thoroughly remove metal contaminants using the oxidation ability of ozone.

In short, the ozone and/or ozone solutions produced according to the present disclosure may replace No. 3 solution, No. 1 solution and No. 2 solution. This would reduce the consumption of $H_2O_2$, $NH_4OH$ and HCl in cleaning solution recipes while improving the cleaning effectiveness, resulting in an economical and environment-friendly wafer cleaning solution.

The following are examples that illustrate applying the ozone produced according to the present disclosure toward methods for forming a passivation layer on a surface of a semiconductor substrate.

A method of passivating a semiconductor substrate fresh out of a furnace may include the following steps:
(1) Place the semiconductor substrate in a micro processing chamber;
(2) Close the micro processing chamber;
(3) Send ozone gas into the micro processing chamber for 2-10 minutes; and
(4) Open the micro processing chamber and remove the semiconductor substrate.

In this method, no HF (Hydrofluoric acid) treatment is implemented prior to forming the passivation, and no drying is needed after forming the passivation. This greatly simplifies the process of, and saves time for, forming the passivation.

Table 1 shown below manifests an example that employs the above method to passivate for 10 minutes a semiconductor substrate that is fresh out of a furnace.

Figure 12:
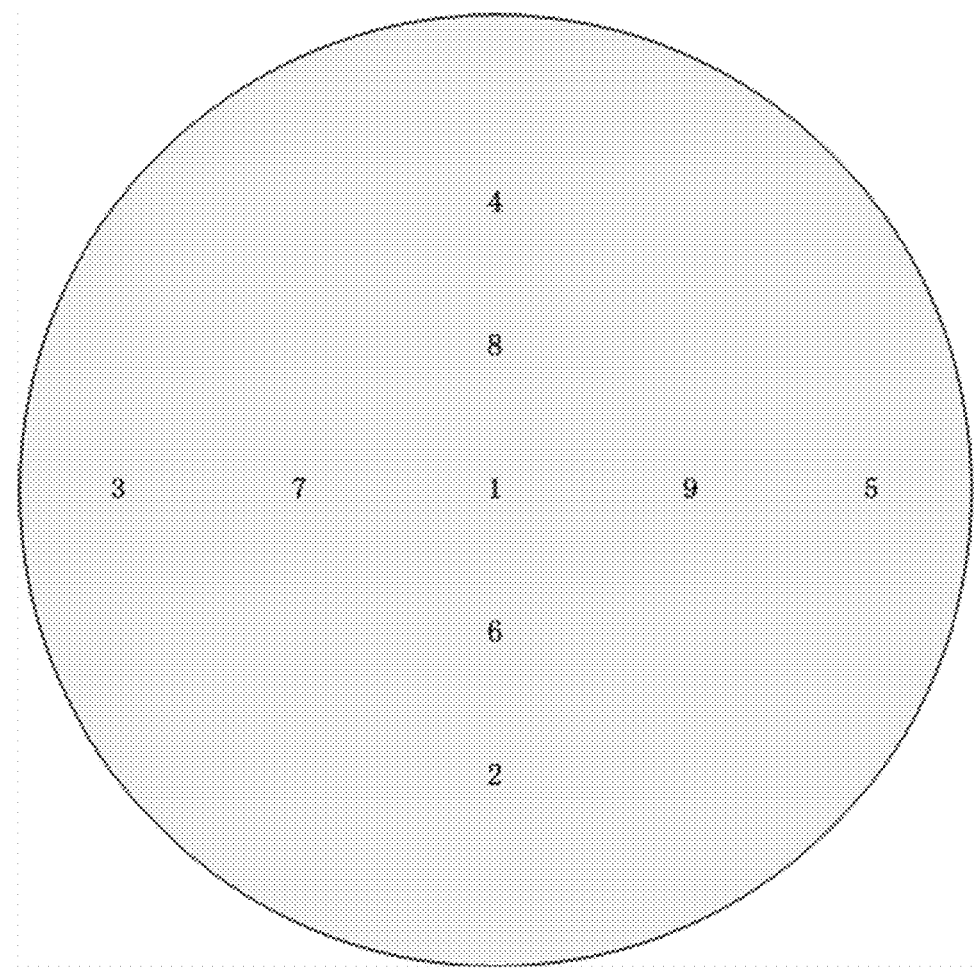
FIG. 12 is a diagram showing positions on a semiconductor substrate passivation layer at which resistivity and film thickness measurements are conducted.

The resistivity and film thickness of the semiconductor substrate passivation layer are measured according to the positions numbered in FIG. 12.

Table 1 shows resistivity measurement data and film thickness measurement data in the above example (9 points are measured).

TABLE 1

| Testing Position | Resistivity $\Omega \cdot cm$ | Film Thickness Å |
|---|---|---|
| 1 | 15.037 | 12.41 |
| 2 | 14.881 | 9.46 |
| 3 | 14.887 | 9.50 |
| 4 | 15.109 | 9.59 |
| 5 | 15.180 | 9.59 |
| 6 | 14.884 | 10.16 |
| 7 | 14.702 | 10.21 |
| 8 | 14.914 | 10.39 |
| 9 | 14.777 | 10.42 |

As shown in Table 1, the semiconductor substrate has rather good quality, as the resistivity of the semiconductor substrate surface passivation layer is uniform across the substrate. In addition, the measured film thickness values are around 9-10 Å, except for the higher value measured close to the center-most inlet (i.e., at testing position 1) of the processing chamber.

The following two methods may be employed to passivate a semiconductor substrate that has already grown a native oxide layer.

The first method may include the following steps:
(1) Place the semiconductor substrate in a micro processing chamber;
(2) Close the micro processing chamber;
(3) Send gas and/or fluid that contains HF into the micro processing chamber;
(4) Send ultrapure water into the micro processing chamber;
(5) Dry the micro processing chamber;
(6) Send ozone gas into the micro processing chamber for 2-10 minutes; and
(7) Open the micro processing chamber and remove the semiconductor substrate.

Table 2 shown below manifests an example that employs the above method to passivate a semiconductor substrate that already has a native oxide layer. The semiconductor substrate is treated by HF fluid for 1 minute before experiencing a passivation treatment for 2 minutes by ozone gas.

The resistivity and film thickness of the semiconductor substrate passivation layer are measured according to the positions numbered in FIG. 12.

Table 2 shows resistivity measurement data and film thickness measurement data in the above example (9 points are measured).

TABLE 2

| Testing Position | Resistivity $\Omega \cdot cm$ | Film Thickness Å |
|---|---|---|
| 1 | 14.202 | 13.8 |
| 2 | 14.04 | 13.37 |
| 3 | 14.312 | 13.46 |
| 4 | 14.14 | 13.6 |
| 5 | 14.316 | 13.3 |
| 6 | 14.014 | 13.37 |
| 7 | 14.205 | 13.58 |
| 8 | 14.112 | 13.37 |
| 9 | 14.16 | 13.3 |

As shown in Table 2, the semiconductor substrate has rather good quality, as the resistivity and the film thickness of the semiconductor substrate surface passivation layer are uniform across the substrate.

The second method may include the following steps:
(1) Place the semiconductor substrate in a micro processing chamber;

(2) Close the micro processing chamber;
(3) Send gas and/or fluid that contains HF into the micro processing chamber;
(4) Send ozone water into the micro processing chamber for 2-10 minutes, wherein the ozone water is obtained by mixing ozone and water using a gas-liquid mixing device, and wherein the gas-liquid mixing device is generally a jet device, a gas-liquid mixing pump, or the like;
(5) Dry the micro processing chamber; and
(6) Open the micro processing chamber and remove the semiconductor substrate.

Table 3 shown below manifests an example that employs the above method to passivate a semiconductor substrate that already has a native oxide layer. The semiconductor substrate is treated by HF fluid for 1 minute before experiencing a passivation treatment for 2 minutes by ozone water.

The resistivity and film thickness of the semiconductor substrate passivation layer are measured according to the positions numbered in FIG. 12.

Table 3 shows resistivity measurement data and film thickness measurement data in the above example (9 points are measured).

TABLE 3

| Testing Position | Resistivity Ω · cm | Film Thickness Å |
| --- | --- | --- |
| 1 | 14.340 | 13.86 |
| 2 | 14.199 | 13.85 |
| 3 | 14.576 | 13.65 |
| 4 | 14.291 | 13.78 |
| 5 | 14.546 | 13.80 |
| 6 | 14.282 | 13.86 |
| 7 | 14.376 | 13.71 |
| 8 | 14.188 | 13.74 |
| 9 | 14.410 | 13.88 |

As shown in Table 3, the semiconductor substrate has rather good quality, as the resistivity and the film thickness of the semiconductor substrate surface passivation layer are uniform across the substrate.

The present disclosure has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the present disclosure as claimed. Accordingly, the scope of the present disclosure is defined by the appended claims rather than the foregoing description of embodiments.

ADDITIONAL NOTES

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. An apparatus for processing one or more surfaces of a semiconductor wafer with one or more ozone-containing fluids, comprising:
   an ozone generator;
   a solvent flask;
   a gas-liquid mixing device;
   a gas-liquid separation device;
   a switching valve; and
   a processing chamber capable of receiving the semiconductor wafer,
   wherein:
      each of the ozone generator and the solvent flask couples respectively to a corresponding inlet of the gas-liquid mixing device,
      the switching valve is coupled between the gas-liquid mixing device and the gas-liquid separation device,
      the switching valve is also coupled between the gas-liquid mixing device and the processing chamber,
      the switching valve is further coupled between the gas-liquid separation device and the processing chamber, and
      at least one outlet of the gas-liquid separation device couples to at least one inlet of the gas-liquid mixing device.

2. The apparatus according to claim 1, further comprising:
   the ozone generator as a first ozone generator;
   the solvent flask as a first solvent flask;
   the gas-liquid mixing device as a first gas-liquid mixing device;
   the gas-liquid separation device as a first gas-liquid separation device;
   the switching valve as a first switching valve;
   a second ozone generator;
   a second solvent flask;
   a second gas-liquid mixing device;
   a second gas-liquid separation device; and
   a second switching valve,
   wherein:
      the second switching valve is coupled between the first switching valve and the first gas-liquid separation device,
      each of the second ozone generator and the second solvent flask couples respectively to a corresponding inlet of the second gas-liquid mixing device,
      the first switching valve is further coupled between the second gas-liquid mixing device and the processing chamber,
      the second gas-liquid mixing devices couples to the second gas-liquid separation device by coupling to the first switching valve which subsequently couples to the second switching valve which subsequently couples to the second gas-liquid separation device, and
      at least one outlet of the second gas-liquid separation device couples to at least one inlet of the second gas-liquid mixing device.

3. The apparatus according to claim 1, further comprising:
   the gas-liquid separation device as a first gas-liquid separation device;
   the switching valve as a first switching valve;
   a second gas-liquid separation device; and
   a second switching valve,
   wherein:
      the at least one outlet of the first gas-liquid separation device couples to the at least one inlet of the gas-liquid mixing device by coupling to the second switching valve which subsequently couples to the at least one inlet of the gas-liquid mixing device,
      the second gas-liquid separation device couples to the first switching valve and the second switching valve, respectively.

4. The apparatus according to claim 1, further comprising:
   another ozone generator coupled to at least one inlet of the processing chamber.

5. The apparatus according to claim 1, wherein the processing chamber comprises an upper chamber portion and a lower chamber portion corresponding to the upper chamber portion, and wherein either or both of the upper chamber portion and the lower chamber portion comprise at least one inlet configured to allow the one or more ozone-containing fluids to enter the processing chamber and at least one outlet configured to discharge the one or more ozone-containing fluids from the processing chamber.

6. The apparatus according to claim 4, wherein the processing chamber comprises an upper chamber portion and a lower chamber portion corresponding to the upper chamber portion, and wherein either or both of the upper chamber portion and the lower chamber portion comprise at least one inlet configured to allow the one or more ozone-containing fluids to enter the processing chamber and at least one outlet configured to discharge the one or more ozone-containing fluids from the processing chamber.

* * * * *